US012183688B2

(12) United States Patent
Ouvarov-Bancalero et al.

(10) Patent No.: US 12,183,688 B2
(45) Date of Patent: Dec. 31, 2024

(54) INTEGRATED CIRCUIT DIE PACKAGE STIFFENERS OF METAL ALLOYS HAVING EXCEPTIONALLY HIGH CTE

(71) Applicant: Intel Corporation, Santa Clara, CA (US)

(72) Inventors: Valery Ouvarov-Bancalero, Scottsdale, AZ (US); John Harper, Chandler, AZ (US); Malavarayan Sankarasubramanian, Tempe, AZ (US); Patrick Nardi, Scottsdale, AZ (US); Bamidele Daniel Falola, Chandler, AZ (US); Ravi Siddappa, Gilbert, AZ (US); James Mertens, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 791 days.

(21) Appl. No.: 17/192,770

(22) Filed: Mar. 4, 2021

(65) Prior Publication Data
US 2022/0285288 A1 Sep. 8, 2022

(51) Int. Cl.
*H01L 23/00* (2006.01)
*H01L 23/06* (2006.01)
*H05K 7/14* (2006.01)

(52) U.S. Cl.
CPC ............ *H01L 23/562* (2013.01); *H01L 23/06* (2013.01); *H05K 7/1461* (2013.01)

(58) Field of Classification Search
CPC ............................. H01L 23/562; H01L 23/06
See application file for complete search history.

(56) References Cited

U.S. PATENT DOCUMENTS

| 7,173,329 B2 | 2/2007 | Frutschy et al. |
| 8,986,806 B1* | 3/2015 | Baloglu ............ H01L 23/49833 |
| | | 428/81 |
| 10,804,205 B1* | 10/2020 | Lin ................... H01L 23/49816 |

(Continued)

OTHER PUBLICATIONS

ASM International, "Chapter 2 Thermal Expansion", ASM International, Materials Park, Ohio, USA; www.asminternational.org; 2002.

(Continued)

*Primary Examiner* — Nathan W Ha
(74) *Attorney, Agent, or Firm* — Essential Patents Group, LLP (57) ABSTRACT

A stiffener for an integrated circuit (IC) package assembly including an IC die electrically interconnected to a substrate. The stiffener is to be mechanically attached to the substrate adjacent to at least one edge of the IC die and have a coefficient of linear thermal expansion (CTE) exceeding that of the substrate. The stiffener may be an "anti-invar" metallic alloy. Anti-invar alloys display "anti-invar" behavior where thermal expansion of the material is significantly enhanced relative to other compositions of the particular alloy system. A package stiffener may be a high-Mn steel, for example, such as ASTM International A128. In other examples, a package stiffener is a MnCuNi, FeNiMn, or FeNiCr alloy having an average CTE over a range of 25-100° C. of at least 18 ppm, and a room temperature modulus of elasticity of at least 120 GPa.

21 Claims, 5 Drawing Sheets

(56) References Cited

U.S. PATENT DOCUMENTS

| | | | | |
|---|---|---|---|---|
| 2005/0139251 | A1* | 6/2005 | Shutoh | C22C 27/00 |
| | | | | 136/239 |
| 2006/0091542 | A1* | 5/2006 | Zhao | H01L 23/36 |
| | | | | 257/E23.101 |
| 2007/0069368 | A1* | 3/2007 | Archer, III | H01L 23/36 |
| | | | | 257/E23.101 |
| 2007/0145571 | A1* | 6/2007 | Lee | H01L 23/04 |
| | | | | 257/E23.101 |
| 2010/0082306 | A1* | 4/2010 | Mills | G16C 10/00 |
| | | | | 703/2 |
| 2011/0215463 | A1* | 9/2011 | Lin | H01L 21/50 |
| | | | | 438/117 |
| 2012/0018871 | A1* | 1/2012 | Lee | H01L 23/562 |
| | | | | 257/E23.194 |
| 2012/0025335 | A1* | 2/2012 | Leclair | H04R 31/00 |
| | | | | 257/416 |
| 2012/0182694 | A1* | 7/2012 | Lin | H01L 23/16 |
| | | | | 361/728 |
| 2014/0332120 | A1* | 11/2014 | Liu | C22C 33/003 |
| | | | | 148/403 |
| 2016/0095209 | A1* | 3/2016 | Starkston | H01L 24/97 |
| | | | | 361/767 |
| 2017/0361301 | A1* | 12/2017 | Lacombe | C08F 2/01 |
| 2018/0151461 | A1* | 5/2018 | Cho | H01L 23/49822 |
| 2018/0342466 | A1* | 11/2018 | Lin | H01L 21/56 |
| 2019/0006293 | A1* | 1/2019 | Beatty | H01L 24/17 |
| 2019/0267332 | A1* | 8/2019 | Sikka | H01L 23/49866 |
| 2020/0006250 | A1* | 1/2020 | Hill | H01L 23/645 |
| 2020/0013732 | A1* | 1/2020 | Sikka | H01L 23/49838 |
| 2021/0221811 | A1* | 7/2021 | Liu | C07D 471/22 |
| 2021/0305117 | A1* | 9/2021 | Lee | H01L 23/36 |
| 2022/0013496 | A1* | 1/2022 | Park | H01L 23/16 |
| 2022/0020656 | A1* | 1/2022 | Jung | H01L 24/83 |
| 2022/0068736 | A1* | 3/2022 | Lo | H01L 25/50 |
| 2022/0189861 | A1* | 6/2022 | Aleksov | H01L 23/562 |
| 2022/0230970 | A1* | 7/2022 | Wang | H01L 23/49816 |
| 2022/0278015 | A1* | 9/2022 | Yeh | H01L 23/3675 |

OTHER PUBLICATIONS

ASTM, "Standard Specification for Thermostat Component Alloys", ASTM International; Designation: B 753-01; West Conshohocken, PA, 2001.

Elsevier Science Ltd., "Invar Materials: Phenomena", Encyclopedia of Materials: Science and Technology; ISBN: 008-0431526; pp. 4268-4272; 2001.

Mawar, A. et al., "Effect of Package Warpage and Composite CTE on Failure Modes in Board-Level Thermal Cycling", SMTAI 2018.

* cited by examiner

INTEGRATED CIRCUIT DIE PACKAGE STIFFENERS OF METAL ALLOYS HAVING EXCEPTIONALLY HIGH CTE

BACKGROUND

Warpage can be a challenge in the fabrication of thin integrated circuit (IC) device packages. Temperature coefficients of linear thermal expansion (CTE) may differ between an IC device die and package materials to which the device die is attached. This difference can induce package warpage following a ball attach or a surface mounting process, for example.

An IC die package stiffener that reduces the amount of warpage for a given package architecture can increase package yield. Conventional IC die package stiffeners are typically of an Austenitic stainless steel alloy (e.g., SAE/SUS 304 or SUS 821L1), or an aluminum alloy (e.g., 6061). However, as the microelectronic industry develops thinner package substrates and/or novel substrate compositions, these conventional materials will become less suitable for package stiffener applications. For example, such materials may fail to provide sufficient stiffness and/or counter the larger CTE of many novel substrate materials. Also, for a given package substrate dimension, the IC die (complex)-to-package ratio (DPR) might be constrained by the package stiffener and associated magnitude of resulting package warp. Alternative package stiffeners that can increase the DPR for a given package substrate footprint (area) are therefore commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material disposed over or under another may be directly in contact or may have one or more intervening materials. Moreover, one material disposed between two materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Embodiments described herein pertain to a stiffener that is to be physically attached to a package substrate adjacent to at least one edge of an IC die. Generally, the package stiffener possesses a combination of high Young's Modulus of elasticity (E), or intrinsic stiffness, and a high CTE. The stiffness of the material improves rigidity of the package while the high CTE counters bending of the package assembly induced by a CTE mismatch between the package substrate and the IC die, which typically is predominantly silicon and therefore has a lower CTE than the substrate. In accordance with some embodiments herein, the stiffener has a mean CTE (e.g., over a 25-100° C. temperature range) significantly exceeding that of many common stainless steels and aluminum alloys. Although many stainless steel alloys have a reasonably high stiffness (e.g., a room temperature modulus of elasticity of 190-200 GPa) and a fairly high mean CTE of ~17 ppm/K from 25-100° C.), many substrate materials under development, particularly for coreless technologies, have a CTE significantly greater than 17 ppm/K.

In exemplary embodiments the package stiffener is predominantly an "anti-invar" metallic alloy. As described further below, anti-invar alloys display the anti-invar effect where thermal expansion of the material is significantly enhanced relative to other compositions of the particular metallic alloy system that display a more typical Grüneisen-type volumetric expansion. The anti-invar effect is in contrast to the "invar" effect characterized by an anomalously small (invariant) CTE as a function of temperature ($\alpha(T)$) relative to the Grüneisen-type crystalline vibrational expansion. In accordance with some embodiments described further below, an IC device package stiffener is predominantly of a "thermostat component alloy," for example as defined in the ASTM International Designation: B 753-01. From these alloys that are typically employed in temperature sensing applications because of their exceptionally high CTE, the inventors have identified a subset of alloys and compositional ranges that further have an advantageously high modulus of elasticity (e.g., exceeding 130 GPA) and are therefore suitable for high-performance, next generation IC device package stiffeners.

Figure 1:
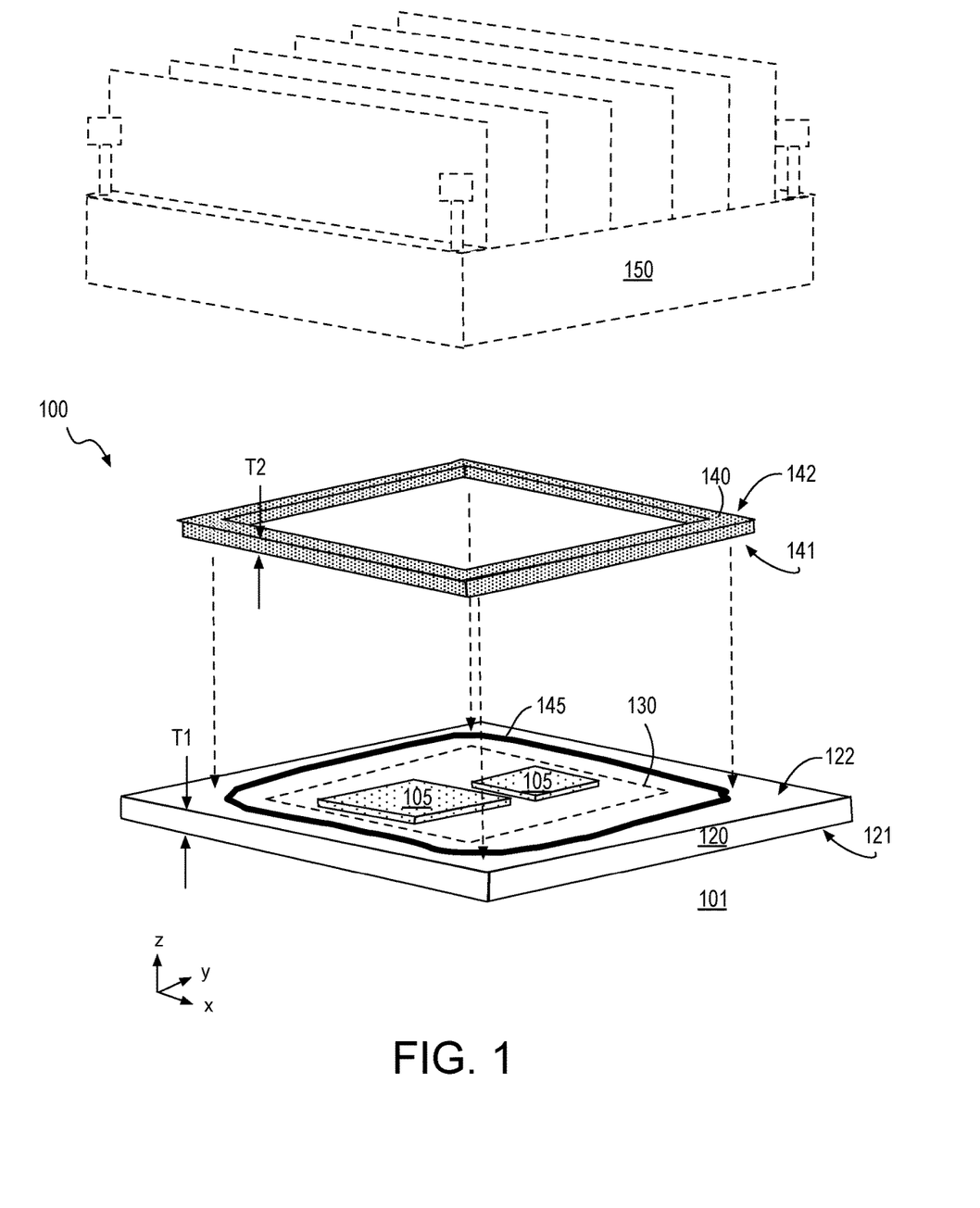
FIG. 1 illustrates an exploded isometric view of an IC device package assembly including a metallic alloy stiffener, in accordance with some embodiments.

FIG. 1 illustrates an exploded isometric view of an exemplary IC device package 100, which may be assembled according to any techniques known in the microelectronics packaging/assembly industry. While IC device package 100 serves as one illustrative example that includes various structural features associated with one or more advantageous embodiments, such an IC device package or assembly may have many alternative architectures without deviating from the scope of the guiding principles described herein. IC device package 100 is generally a "lidless" architecture where a heat sink 150 may be applied directly over IC device package 100, for example with only a thermal interface material (TIM) therebetween. However, a lidded device package architecture that further includes an integrated heat spreader (not depicted) between a system-level thermal solution and IC die 105 is also possible. If present, an integrated heat spreader may be any sheet good, such as a metal or graphite, that has high thermal conductivity in one or more of the xyz dimensions. Heat sink 150 is illustrated in dashed line as being associated with a system-level thermal solution, which may be applied to other subassemblies beyond IC device package 100. Heat sink 150 may have any architecture as embodiments herein are not limited in this context. For example, a system-level thermal solution may instead comprise a cold plate or heat pipe (vapor chamber).

An active side of each IC die 105 includes integrated circuitry having die interfaces that are attached to package substrate 120 through a plurality of first-level electrical interconnects (not depicted). First-level interconnects (FLI) may be microbumps or any solder-based (e.g., solder balls) or solder-free (e.g., plated build-up) features as embodiments are not limited in this context. Each IC die 105 may have been prepared and electrically tested, for example according to any suitable fabrication, die prep, and e-test processes. IC die 105 may have any z-dimension thickness with an exemplary range being 50 μm-800 μm.

As an example, IC die 105 may include any of a wireless radio circuit, microprocessor or graphics processor circuit, electronic memory circuit, floating point gate array (FPGA), power management and/or power supply circuitry, or MEMS device. In some specific examples, a first IC die 105 is a microprocessor and a second IC die 205 is an electronic memory. Each IC die 105 may comprise one or more device layers, each of which further comprises transistors (e.g., MOSFETs). Where multiple device layers are present, the IC die 105 may be referred to as a chip stack, which may be monolithic or a sub-assembly of IC chips. For example, an electronic memory may comprise a vertical (z-dimensional) stack of multiple IC chips that are functional as a single IC die. Although two IC die 105 are illustrated as an example of a multi-chip package, any number of IC die 105 may be interfaced to package substrate 120.

Package substrate 120 may comprise any type of substrate suitable for electrically interconnecting to IC die 105. In multi-chip embodiments, substrate 120 comprises electrical routing traces interconnecting the multiple IC die 105 coupled to substrate 120. Substrate 120 further includes routing traces interconnect each IC die 105 to a next-level host component 101 to which a bottom package substrate surface 121 may be coupled (e.g., through second-level electrical interconnects). Host component 101 may be a printed circuit board (PCB), or another, intermediate package-level integration, for example.

Package substrate 120 may also provide structural support for IC die 105. Package substrate may be a multi-layer structure that includes levels of package metallization and layers of a package dielectric material that have been successively built-up around a substrate core. The package core may be a dielectric material having a thickness of around 100 μm, for example. Conductive through-via structures may be embedded within the core to electrically couple top and bottom sides of the package substrate. In other embodiments, package substrate 120 is a coreless multi-layer structure. According to some coreless embodiments, substrate 120 may comprise alternating layers of dielectric material and metal that are built-up upon a sacrificial donor substrate, or built up directly on IC die 105, which is sometimes referred to as a "bumpless build-up process." Whether cored or coreless, substrate 120 may have a thickness T1 that varies widely, for example from 50 μm to 5 mm.

Cored or coreless substrates may include epoxy resins, FR4, one or more semiconductor interposers (e.g., silicon), etc. Cored or coreless substrates may further include one or more insulating layers, such as glass-reinforced epoxy, FR-4, polytetrafluoroethylene (Teflon), cotton-paper reinforced epoxy (CEM-3), phenolic-glass (G3), paper-phenolic (FR-1 or FR-2), polyester-glass (CEM-5), ABF (Ajinomoto Build-up Film). Other dielectric materials, such as glass, or any combinations thereof, may also be incorporated into substrate 120.

As described further below, IC device package 100 includes a stiffener 140 that is to advantageously counterbalance a bending strain driven by stress introduced into device package 100 by a CTE mismatch between IC die 105 and a package substrate 120. Stiffener 140 is a structural member with a bottom surface 141 that is physically affixed to package substrate 120 in any suitable manner. Stiffener 140 may be affixed to substrate 120, for example, with an adhesive 145. Adhesive 145 may be an epoxy resin, or suitable alternative, as embodiments are not limited in this context. Although adhesive 145 is illustrated as having been applied to a top substrate surface 122, adhesive 145 may also be applied to bottom stiffener surface 141 in the alternative, or in the addition, to the illustrated substrate surface application.

Stiffener 140 is laterally (e.g., within the x-y plane) adjacent to at least one edge of at least one IC die 105. Stiffener 140 may have any geometry and dimensions suitable for locally or globally reducing warp of IC device package 100 to some predetermined threshold level. In the illustrated embodiment, stiffener 140 is a contiguous, four-sided frame that completely surrounds the one or more IC die 105. The one or more IC die 105 are therefore enclosed within an interior area of stiffener 140. As a sub-assembly of IC device package 100, stiffener 140 advantageously has minimal height (e.g., z-dimension). However, stiffener thickness T2 from bottom surface 141 to a top surface 142 may vary widely, for example from a foil of around 50 μm to plate of around 3 mm.

Figure 2A:
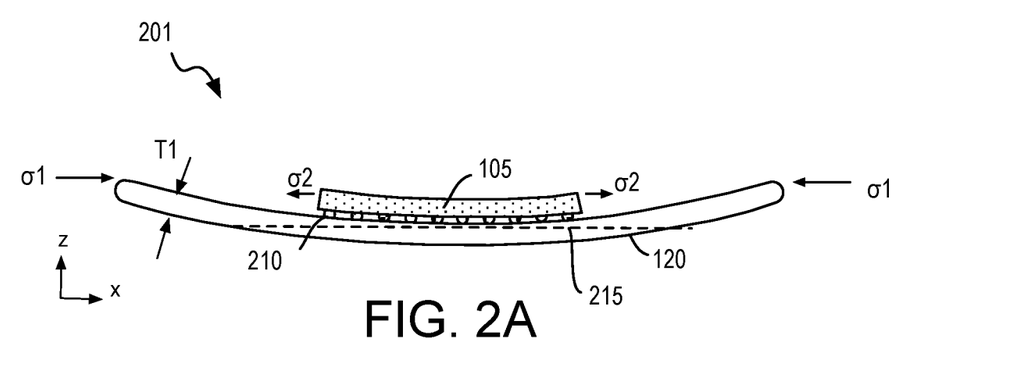
FIGS. 2A, 2B and 2C are cross-sectional views illustrating IC device package warpage as a function of assembly component CTE, in accordance with some embodiments.
Figure 2B:
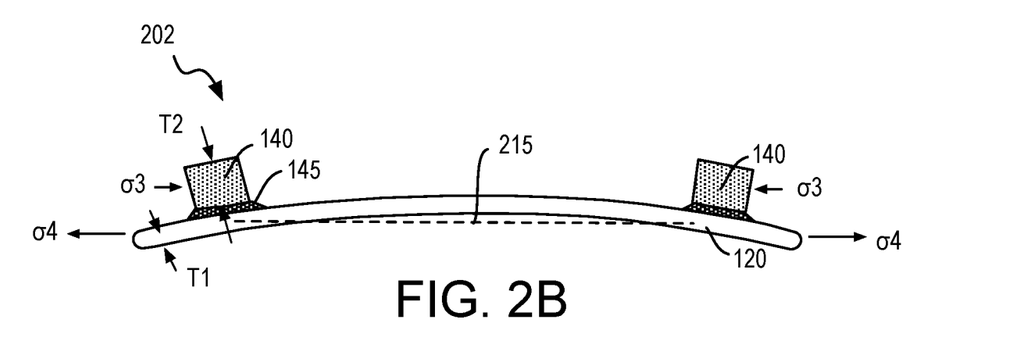
Figure 2C:
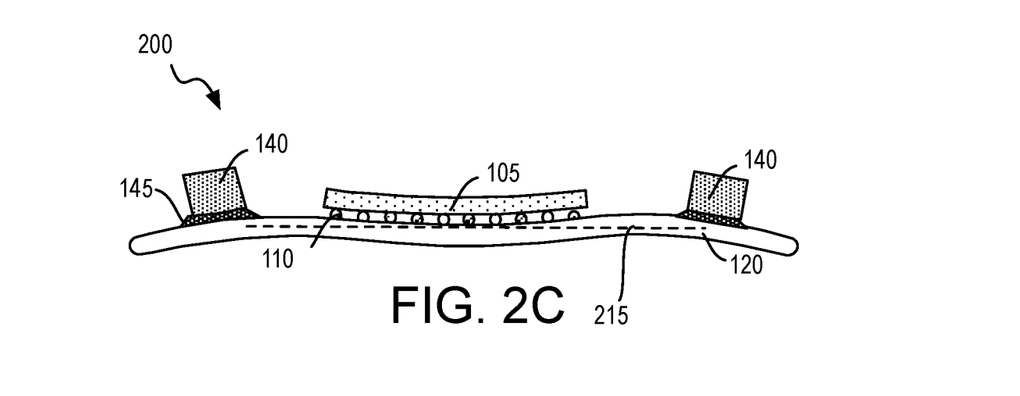

FIGS. 2A, 2B and 2C are cross-sectional views illustrating IC device package warpage as a function of assembly component CTE, in accordance with some embodiments. In FIG. 2A, an IC device package subassembly 201 includes substrate 120 and IC die 105. In this example, a front side of IC die 105 is electrically coupled to substrate 120 with solder interconnects 210. As noted above, solder interconnects 210 may be microbumps or solder balls. Although not illustrated for the sake of clarity, IC device package subassembly 201 may further comprise an underfill material between IC die 105 and substrate 120. Such an underfill material may have any suitable composition (e.g., a polymer dielectric such as one including an epoxy resin with a filler like fumed silica). The epoxy resin and filler may be selected to achieve a good coefficient of thermal expansion (CTE) match with solder interconnects 210 and/or with IC die 105.

Although the specific compositions of IC die 105 may vary as noted above, in some exemplary embodiments IC die 105 has a mean CTE ($\alpha$) over a temperature range of 25-100° C. that is less than 5 ppm/K (e.g., substantially equal to that of silicon). Although the specific composition of the various materials present within substrate 120 may also vary as noted above, in exemplary cored embodiments substrate 120 has a mean CTE over the temperature range of 25-100° C. of at least 17 ppm/K. In exemplary coreless embodiments substrate 120 has a mean CTE of at least 18 ppm/K. When heated, for example during ball attach, IC die 105 therefore does not expand as much as substrate 120. Substrate 120 is thus placed under compressive stress σ1 while IC die 105 is under tensile stress σ2. Because substrate 120 may have a relatively low elastic modulus, substrate subassembly 201 may deform extensively when subjected to stresses σ1 and/or σ2. As a result of the CTE of IC die 105 being lower than that of substrate 120, substrate 120 incurs a "concave-up" strain relative to the flat reference plane 215 drawn in dashed line.

In FIG. 2B, an IC device package subassembly 202 includes substrate 120 and stiffener 140. In this example, stiffener 140 is again physically connected to substrate 120 by adhesive 145. In accordance with embodiments herein, stiffener 140 has a mean CTE exceeding that of substrate 120. Hence, in some exemplary embodiments where substrate 120 has a mean CTE of at least 17 ppm/K, stiffener 140 has a mean CTE exceeding 17 ppm/K. In other exemplary embodiments where substrate 120 has a mean CTE of at least 18 ppm/K, stiffener 140 has a mean CTE greater than 18 ppm/K. When heated, for example during ball attach, substrate 120 does not expand as much as stiffener 140. Stiffener 140 is therefore under tensile stress σ3 while substrate 120 is under tensile stress σ4. Stiffener 140 is advantageously of a material having a higher elastic (e.g., Young's) modulus than substrate 120. Stiffener 140 may have a thickness T2 sufficient to have greater mechanical stiffness than substrate 120. Hence, substrate subassembly 202 may deform extensively when subjected to stresses σ3 and/or σ4 to have a "convex-up" strain relative to flat reference plane 215.

FIG. 2C illustrates an IC die package 200 that is an integration of subassemblies 201 and 202 to arrive at an assembly that has the opposing stresses counterbalanced to improve package planarity/reduce package warpage. Because the CTE of substrate 120 will likely trend upward in subsequent generations of packaging technology, exceptionally high CTE is needed to achieve a significant reduction in warpage.

In accordance with some embodiments, stiffener 140 is a bulk material of substantially homogenous composition. Stiffener 140 may be a preform, for example crafted by milling or stamping a sheet good having a predetermined composition. In exemplary embodiments, stiffener 140 is a metallic alloy having two or more metal constituents. The metallic alloy may advantageously have constituent compositions that are within the range of possible compositions for a particular alloy system displaying the anti-invar effect. For such compositions, the stiffener's volume change as a function of temperature change is exceptionally high. Although ASTM International Specification B-753 identifies a number of material systems and compositional ranges that display the anti-invar effect, in exemplary embodiments herein stiffener 140 is one of a subset of these alloys that further has a modulus of elasticity of at least 120 GPa at room temperature (25° C.), and advantageously at least 180 GPa.

Figure 3:
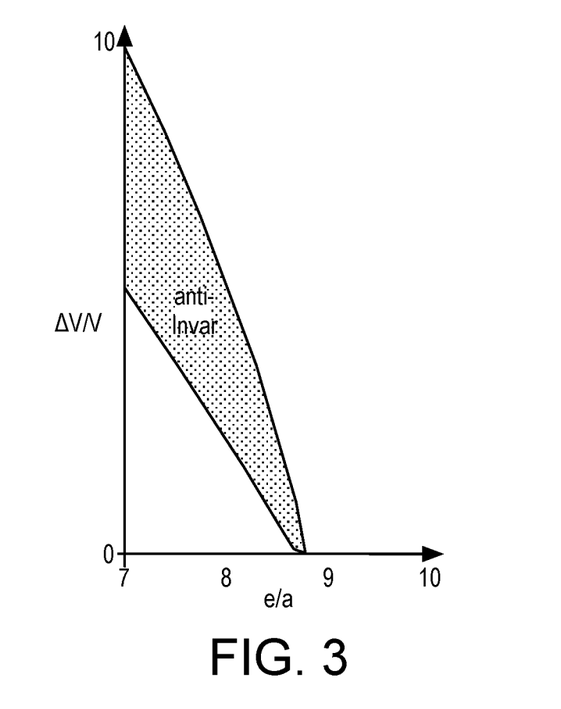
FIG. 3 is a graph illustrating an anti-invar domain for metallic alloys within which a composition of a metallic alloy stiffener in accordance with some embodiments can be found.

Some exemplary systems satisfying the above criteria include alloys of two or more of Fe, Mn, Ni, Pt, Cr, Co, or Cu. FIG. 3 is a graph illustrating an anti-invar domain applicable for a number of such metallic alloys within which the composition of a stiffener in accordance with some embodiments can be found. The illustrated anti-invar domain is demarked as a function a relative change in volume ($\Delta V/V$) and a ratio of the number of valence electrons per atom (e/a) for the alloy. The e/a ratio can be readily determined for any particular alloy composition, which is most typically given in weight percentages. As shown in FIG. 3, the anti-invar domain has an e/a ratio of less than 8.5. Hence, for a stiffener of a particular alloy system, such as one that is primarily Fe and Ni (i.e., $Fe_xNi_{100-x}$), x may be any value for which the e/a ratio of the alloy is less than 8.5. In accordance with other embodiments, for a stiffener of an alloy that is primarily Mn and either Cu or Ni (e.g., $Mn_xCu_{100-x}$), x may again be any value for which the e/a ratio for the alloy is less than 8.5. As evident from FIG. 3, the largest values of ΔV/V are associated with the smallest e/a ratio, so stiffeners of alloys having an e/a ratio less than 8 are advantageous for increasing the mean CTE of stiffener 140 to values of 20-25 ppm/K, or more.

In some embodiments, stiffener 140 is primarily Fe and at least one of Mn, Ni, Pt, Cr, or Co. Examples of such alloy systems include Fe—Mn alloys, Fe—Ni alloys, Fe—Pt alloys, and Fe—Co alloys. Exemplary alloy systems satisfying these criteria also include alloys of three or more of Fe, Mn, Ni, Pt, Cr, Co, or Cu. For some such embodiments, stiffener 140 is primarily Fe and at least two of Mn, Cr, or Mn with some examples being Fe—Ni—Mn and Fe—Ni—Cr alloys.

The Fe—Ni—Cr system includes $Fe_{75}Ni_{22}Cr_3$ (wt %), which is also known as ASTM: B573 T-22. The T-22 alloy is advantageous as a standardize composition that is commercially available. The T-22 alloy has a mean CTE of 18 ppm/K from 25-100° C. and a relatively high Young's Modulus of around 186 GPa at room temperature. Notably, however, a $Fe_xNi_yMn_z$ alloy may deviate from the T-22 standard and still retain an elevated CTE, at least to the extent that the e/a ratio remains under 8.5. Within this anti-invar range, x may be advantageously within 2 wt % of 75 wt %, y may be advantageously within 2 wt % of 25 wt %, and z may be advantageously within 2 wt % of 3 wt %.

The Fe—Ni—Mn system includes $Fe_{74}Ni_{20}Mn_6$ (wt %), which is also known as ASTM: B753 T-20. The T-20 alloy is advantageous as also a standardize composition that is commercially available. The T-20 alloy has the highest mean CTE of any ferrous alloy (e.g., 19 ppm/K from 25-100° C.), and an even higher Young's Modulus of around 196 GPa at room temperature. T-20 may therefore be preferable over T-22.

In other embodiments, stiffener 140 is primarily Mn and at least one of Cu or Ni with some examples being Mn—Cu alloys and Mn—Cu—Ni alloys. The Mn—Cu—Ni system includes $Mn_{72}Cu_{18}Ni_{10}$ (wt %), which is also known as ASTM: B753 T-10. The T-10 alloy has one of the highest mean CTE values of all known alloys (e.g., 27 ppm/K from 25-100° C.), and a fairly high Young's Modulus of ~130 GPa at room temperature. Depending on the CTE of a package substrate and any limitation on stiffener thickness, T-10 may be selected over T-20 as a more suitable composition for stiffener 140.

Although in some embodiments stiffener 140 includes no other material than one of the metallic alloys described above, one or more of these alloys may not offer sufficient corrosion resistance and/or surface passivation. Accordingly, in some embodiment stiffener 140 may further include a surface finish on one of the metallic alloys described above. The surface finish may include a layer of Ni or Au, for example. The surface finish may further include a layer of Cu between the Ni/Au layer and the underlying bulk material. For embodiments with a surface finish, the bulk alloy material contributes to the majority of the stiffener thickness. Although surface finish thicknesses may vary, in some embodiments, the surface finish has a thickness less than 50 µm.

Figure 4:
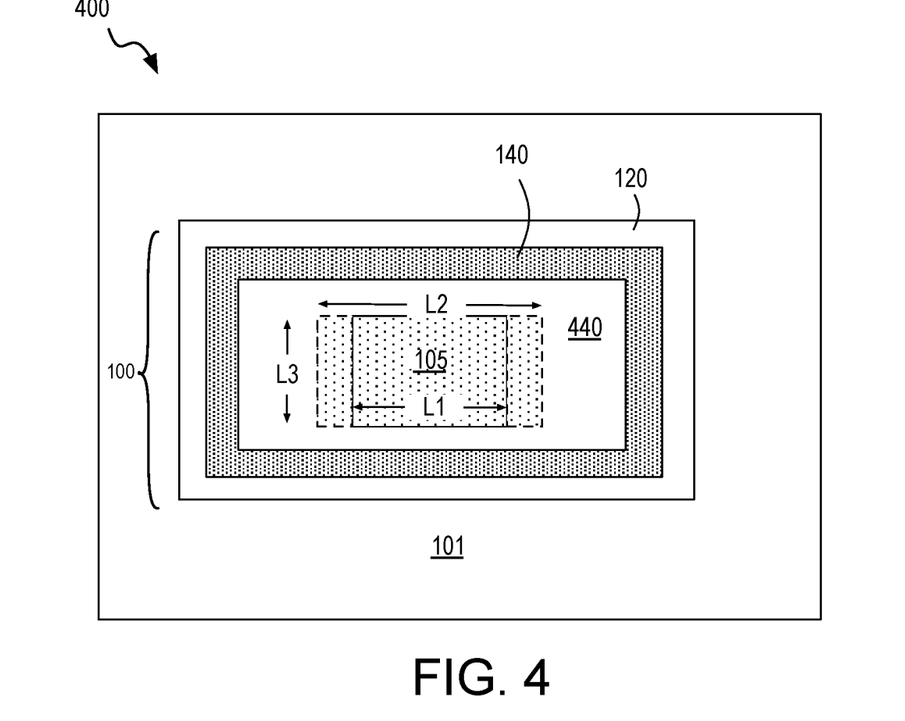
FIG. 4 is a plan view of an IC package assembly including a metallic alloy stiffener, in accordance with some embodiments.

FIG. 4 is a plan view of a system-level assembly 400 including a metallic alloy stiffener, in accordance with some embodiments. System-level assembly 400 includes IC device package 100, substantially as described elsewhere herein. As described above, a bottom side of substrate 120 is electrically coupled to a host component 101. With stiffener 140 comprising a metallic alloy in accordance with embodiments herein, at least one lateral dimension of IC die 105 can be increased from a maximum dimension possible for a stiffener of lesser CTE. For example, as illustrated by dashed lines, a length of the one or more IC die 105 may be increased from L1 to L2 for a given package design and given threshold magnitude of warpage. An interior area 440 of stiffener 140 may therefore be larger (exceeding the L1/L2*L3 area of IC die 105), enabling a larger DPR. Although interior area 440 may vary, in some exemplary embodiments interior area 440 is between 1000 mm² and 3000 mm².

Figure 5:
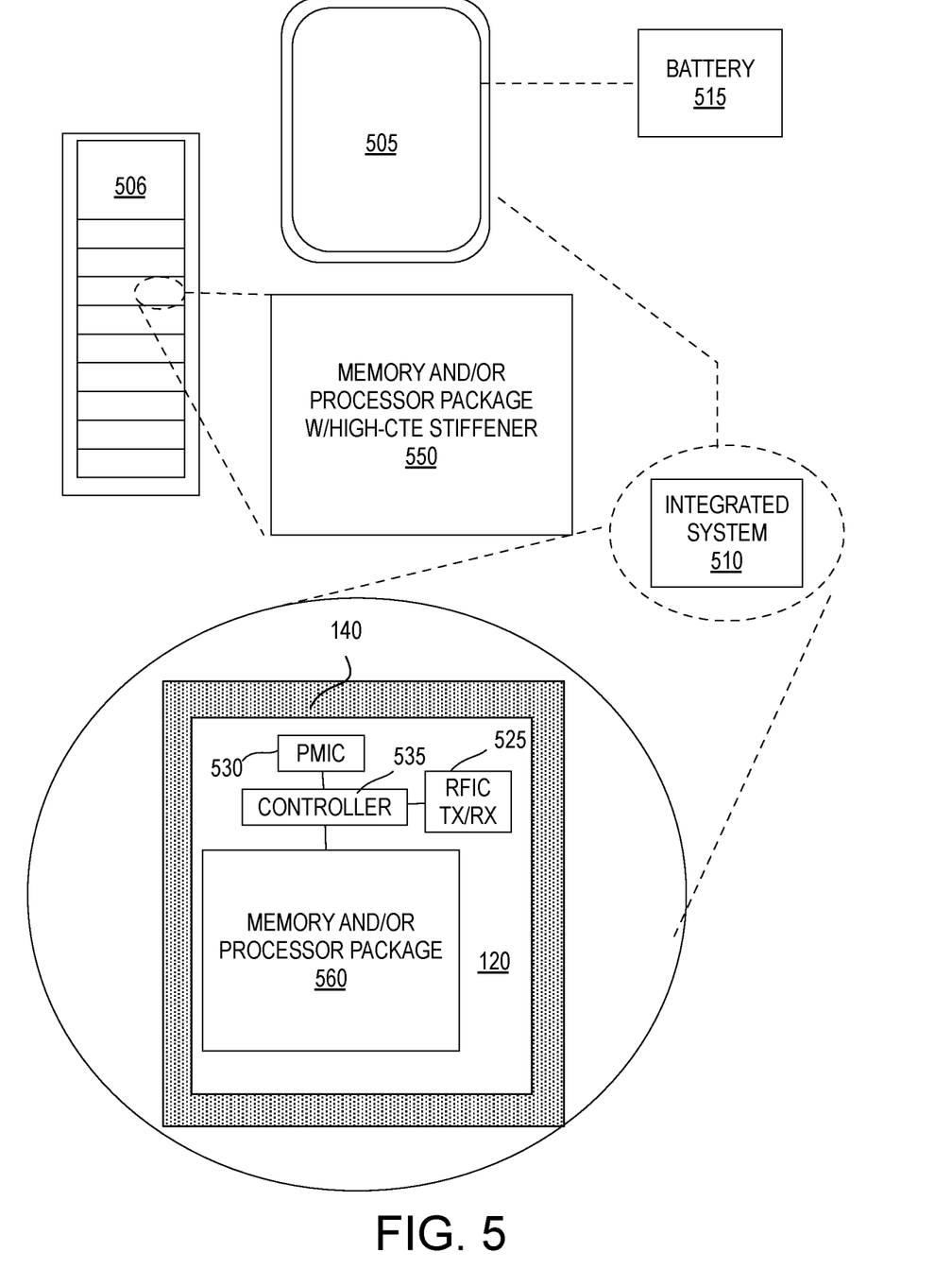
FIG. 5 illustrates a mobile computing platform and a data server machine employing an integrated circuit package that includes a metallic alloy stiffener in accordance with some embodiments.

FIG. 5 illustrates a system in which a mobile computing platform 505 and/or a data server machine 506 that includes an IC package assembly further including a stiffener of exceptionally high CTE, for example in accordance with the embodiments described elsewhere herein having anti-invar behavior. The server machine 506 may be any commercial server, for example including any number of high-performance computing platforms disposed within a rack and networked together for electronic data processing. In the illustrated embodiment, server machine 506 includes a memory and/or processor package 550 that has a high-CTE stiffener, for example in accordance with the embodiments described elsewhere herein having anti-invar behavior.

The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a package-level integrated system 510, and a battery 515.

The integrated system 510 is further illustrated in the expanded view, and may include memory circuitry (e.g., DRAM) and/or logic circuitry (e.g., a microprocessor, graphics processor, or the like) 560 coupled to package substrate 120 and within an interior area of stiffener 140. Within the interior area of stiffener 140 is also a power management IC (PMIC) 530 and a radio frequency IC (RFIC) 525 having an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 6:
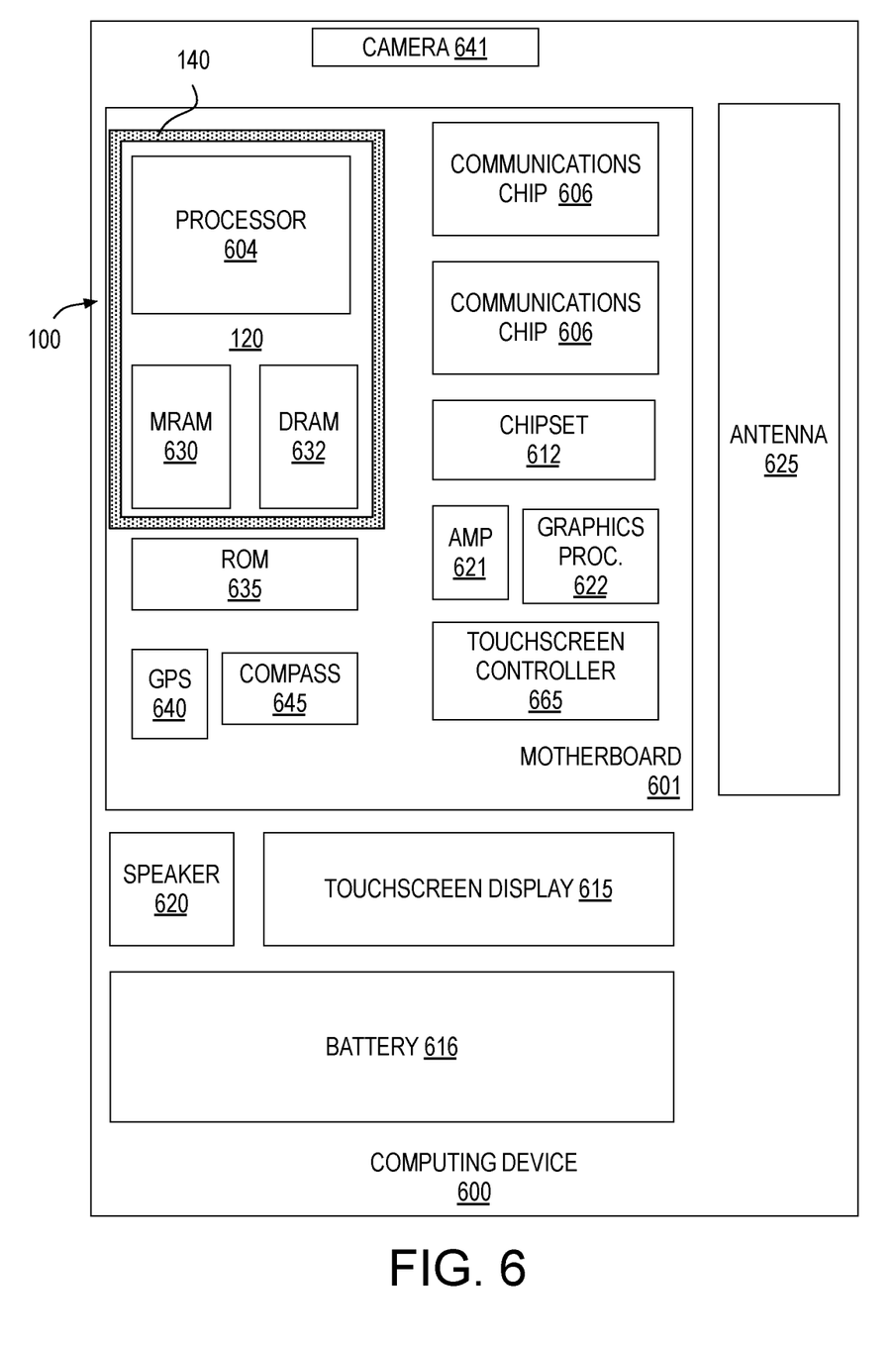
FIG. 6 is a functional block diagram of an electronic computing device, in accordance with some embodiments.

FIG. 6 is a functional block diagram of an electronic computing device 600, in accordance with some embodiments. Device 600 further includes motherboard 601 hosting a number of components, such as, but not limited to, IC device package 101. In this example, processor 604 is part of an IC package assembly including electronic memory MRAM 630 and/or DRAM 632. IC device package 101 further includes stiffener 140, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 606 may also be physically and/or electrically coupled to motherboard 601. Depending on its applications, computing device 600 may include other components that may or may not be physically and electrically coupled to package substrate 220. These other components include, but are not limited to, non-volatile memory (e.g., ROM 635), flash memory (e.g., NAND or NOR), a graphics processor 622, a digital signal processor, a crypto processor, a chipset 612, an antenna 625, touchscreen display 615, touchscreen controller 665, battery 616, audio codec, video codec, power amplifier 621, global positioning system (GPS) device 640, compass 645, accelerometer, gyroscope, speaker 620, camera 641, and mass storage device (such as hard disk drive, solid-state drive (SSD), compact disk (CD), digital versatile disk (DVD), and so forth, or the like.

Communication chips 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 606 may implement any of a number of wireless standards or protocols, including, but not limited to, those described elsewhere herein. As discussed, computing device 600 may include a plurality of communication chips 606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) device assembly comprises a package substrate, an IC die including a first side electrically interconnected to a first side of the package substrate, and a stiffener physically coupled to the package substrate and adjacent to an edge of the IC die, wherein the stiffener comprises an alloy of metals with a constituent concentration for which the alloy displays the anti-invar effect.

In second examples, for any of the first examples the alloy has a mean CTE, over the range of 25°-100° C., that is greater than that of the package substrate, and the alloy has a room temperature modulus of elasticity of at least 120 GPa.

In third examples, for any of the first through second examples the mean CTE is greater than 18 ppm/K.

In fourth examples, for any of the first through third examples the room temperature modulus of elasticity is at least 180 GPa.

In fifth examples, for any of the first through fourth examples the CTE is greater than 20 ppm/K.

In sixth examples, for any of the first through fifth examples the alloy comprises two or more of Fe, Mn, Ni, Pt, Cr, Co, or Cu.

In seventh examples, for any of the first though sixth examples the alloy has a composition for which a ratio of valence electrons/atoms is less than 8.5.

In eighth examples, for any of the first through seventh examples the alloy comprises three or more of Fe, Mn, Ni, Pt, Cr, Co, or Cu.

In ninth examples, for any of the first through eighth examples the alloy comprises primarily Fe and at least one of Mn, Ni, Pt, Cr, or Co.

In tenth examples, for any of the first through ninth examples the alloy comprises primarily Fe and two of Ni, Cr, or Mn.

In eleventh examples, for any of the first through tenth examples the alloy is $Fe_xNi_yMn_z$, and x is within 2 wt % of 74 wt %, y is within 2 wt % of 20 wt %, and z is within 2 wt % of 6 wt %.

In twelfth examples, for any of the first through eleventh examples the alloy is $Fe_xNi_yCr_z$, and x is within 2 wt % of 75 wt %, y is within 2 wt % of 25 wt %, and z is within 2 wt % of 3 wt %.

In thirteenth examples, for any of the first through eighth examples, the alloy comprises primarily Mn and at least one of Cu or Ni.

In fourteenth examples, for any of the thirteenth examples the alloy is $Mn_xCu_yNi_z$, and wherein x is within 2 wt % of 72 wt %, y is within 2 wt % of 18 wt %, and z is within 2 wt % of 10 wt %.

In fifteenth examples, for any of the first through fourteenth examples the stiffener further comprises a surface finish over the alloy, the surface finish comprising at least one of Ni or Au.

In sixteenth examples, a computing system comprises the IC device package assembly of the first examples. The system comprises a system-level thermal solution coupled to a second side of the IC die. The system comprises a host board coupled to a second side of the package substrate by plurality of second electrical interconnects.

In seventeenth examples, an integrated circuit (IC) die package stiffener comprises a contiguous frame with a bottom surface to attach to a package substrate, the frame to enclose one or more IC die within an interior of the frame, wherein the frame comprises a substantially homogenous metal alloy comprising two or more of Fe, Mn, Ni, Pt, Cr, Co, or Cu and having a composition for which a ratio of valence electrons/atoms is less than 8.5.

In eighteenth examples, for any of the sixteenth through seventeenth examples the metal alloy is $Fe_xNi_yMn_z$, and x is within 2 wt % of 74 wt %, y is within 2 wt % of 20 wt %, and z is within 2 wt % of 6 wt %.

In nineteenth examples, for any of the sixteenth through seventeenth examples the metal alloy is $Fe_xNi_yCr_z$, and x is within 2 wt % of 75 wt %, y is within 2 wt % of 25 wt %, and z is within 2 wt % of 3 wt %.

In twentieth examples, for any of the sixteenth through seventeenth examples the metal alloy is $Mn_xCu_yNi_z$, and x is within 2 wt % of 72 wt %, y is within 2 wt % of 18 wt %, and z is within 2 wt % of 10 wt %.

In twenty-first examples, for any of the sixteenth through twentieth examples the frame is substantially rectangular, the interior has an area of 1000-3000 mm$^2$, and the frame has a thickness of 50 μm-3 mm from the bottom surface to a top surface of the frame.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) device assembly, comprising:
a package substrate;
an IC die including a first side electrically interconnected to a first side of the package substrate; and
a stiffener physically coupled to the package substrate and adjacent to an edge of the IC die, wherein the stiffener comprises an alloy of metals with a constituent concentration for which the alloy displays the anti-invar effect, has a mean CTE, over a range of 25°-100° C., greater than 18 ppm/K, and a room temperature modulus of elasticity exceeding 130 GPa.

2. The IC device assembly of claim 1, wherein the mean CTE is greater than that of the package substrate.

3. The IC device assembly of claim 2, wherein the mean CTE is at least 19 ppm/K.

4. The IC device assembly of claim 3, wherein the room temperature modulus of elasticity is at least 180 GPa.

5. The IC device assembly of claim 3, wherein the mean CTE is at least 20 ppm/K.

6. The IC device assembly of claim 1, wherein the alloy comprises two or more of Fe, Mn, Ni, Pt, Cr, Co, or Cu.

7. The IC device assembly of claim 6, wherein the alloy has a composition for which a ratio of valence electrons/atoms is less than 8.5.

8. The IC device assembly of claim 6, wherein the alloy comprises three or more of Fe, Mn, Ni, Pt, Cr, Co, or Cu.

9. The IC device assembly of claim 6, wherein the alloy comprises primarily Fe and at least one of Mn, Ni, Pt, Cr, or Co.

10. The IC device assembly of claim 9, wherein the alloy comprises primarily Fe and two of Ni, Cr, or Mn.

11. The IC device assembly of claim 10, wherein the alloy is $Fe_xNi_yMn_z$, and wherein x is within 2 wt % of 74 wt %, y is within 2 wt % of 20 wt %, and z is within 2 wt % of 6 wt %.

12. The IC device assembly of claim 11, wherein the alloy is $Fe_xNi_yCr_z$, and wherein x is within 2 wt % of 75 wt %, y is within 2 wt % of 25 wt %, and z is within 2 wt % of 3 wt %.

13. The IC device assembly of claim 8, wherein the alloy comprises primarily Mn and at least one of Cu or Ni.

14. The IC device assembly of claim 13, wherein the alloy is $Mn_xCu_yNi_z$, and wherein x is within 2 wt % of 72 wt %, y is within 2 wt % of 18 wt %, and z is within 2 wt % of 10 wt %.

15. The IC device assembly of claim 1, wherein the stiffener further comprises a surface finish over the alloy, the surface finish comprising at least one of Ni or Au.

16. A computing system, comprising:
a package substrate;
an IC die including a first side electrically interconnected to a first side of the package substrate;
a stiffener physically coupled to the package substrate and adjacent to an edge of the IC die, wherein the stiffener comprises an alloy of metals with at least 72 wt % Fe and at least 18 wt % Ni, or at least 70 wt % Mn and at least 16 wt % Cu;
a system-level thermal solution coupled to a second side of the IC die; and
a host board coupled to a second side of the package substrate by plurality of second electrical interconnects.

17. An integrated circuit (IC) die package stiffener, the stiffener comprising:
a contiguous frame with a bottom surface to attach to a package substrate, the frame to enclose one or more IC die within an interior of the frame, wherein the frame is of a substantially homogenous metal alloy comprising two or more of Fe, Mn, Ni, Pt, Cr, Co, or Cu and having a composition for which a ratio of valence electrons/atoms is less than 8.5.

18. The IC die package stiffener of claim 17, wherein the metal alloy is $Fe_xNi_yMn_z$, and wherein x is within 2 wt % of 74 wt %, y is within 2 wt % of 20 wt %, and z is within 2 wt % of 6 wt %.

19. The IC die package stiffener of claim 17, wherein the metal alloy is $Fe_xNi_yCr_z$, and wherein x is within 2 wt % of 75 wt %, y is within 2 wt % of 25 wt %, and z is within 2 wt % of 3 wt %.

20. The IC die package stiffener of claim 17, wherein the metal alloy is $Mn_xCu_yNi_z$, and wherein x is within 2 wt % of 72 wt %, y is within 2 wt % of 18 wt %, and z is within 2 wt % of 10 wt %.

21. The IC die package stiffener of claim 17, wherein the frame is substantially rectangular, the interior has an area of 1000-3000 mm², and the frame has a thickness of 50 μm-3 mm from the bottom surface to a top surface of the frame.

* * * * *